United States Patent
Morita et al.

(10) Patent No.: US 10,864,600 B2
(45) Date of Patent: Dec. 15, 2020

(54) LASER MACHINING DEVICE (71) Applicant: Mitsubishi Electric Corporation, Tokyo (JP)

(72) Inventors: Daiji Morita, Tokyo (JP); Tomotaka Katsura, Tokyo (JP); Hiroaki Kurokawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/347,815

(22) PCT Filed: Mar. 21, 2017

(86) PCT No.: PCT/JP2017/011119
§ 371 (c)(1),
(2) Date: May 7, 2019

(87) PCT Pub. No.: WO2018/173101
PCT Pub. Date: Sep. 27, 2018

(65) Prior Publication Data
US 2019/0366477 A1 Dec. 5, 2019

(51) Int. Cl.
*B23K 26/06* (2014.01)
*H01S 5/40* (2006.01)
(Continued)

(52) U.S. Cl.
CPC ........ *B23K 26/0648* (2013.01); *B23K 26/067* (2013.01); *B23K 26/0665* (2013.01);
(Continued)

(58) Field of Classification Search
CPC ............ B23K 26/0648; B23K 26/0665; B23K 26/067; G02B 27/1086; G02B 6/4204; G02B 6/425; H01S 5/4012; H01S 5/4087
(Continued)

(56) References Cited

U.S. PATENT DOCUMENTS 5,430,816 A * 7/1995 Furuya ................. B23K 26/067
385/33
2008/0008431 A1 1/2008 Shikii et al.
(Continued)

FOREIGN PATENT DOCUMENTS

DE 11 2015 004 727 7/2017
JP 2008-42178 A 2/2008
(Continued)

OTHER PUBLICATIONS

International Search Report and Written Opinion dated May 23, 2017 for PCT/JP2017/011119 filed on Mar. 21, 2017, 6 pages including translation of the International Search Report.
(Continued)

*Primary Examiner* — Tu B Hoang
*Assistant Examiner* — Vy T Nguyen
(74) *Attorney, Agent, or Firm* — Xsensus LLP (57) ABSTRACT

A laser machining device includes a plurality of oscillators to emit laser beams having different wavelengths from each other; a machining head to emit laser beams emitted from the respective oscillators to a machining object; a plurality of transmission fibers to transmit the laser beams to the machining head; a wavelength dispersion element; and a focusing lens to superpose the laser beams emitted from the transmission fibers, wherein the wavelength dispersion element is arranged at a position at which the laser beams are superposed by the focusing lens.

6 Claims, 5 Drawing Sheets

(51) Int. Cl.
    *G02B 6/42*           (2006.01)
    *B23K 26/067*      (2006.01)
    *G02B 27/10*       (2006.01)

(52) U.S. Cl.
    CPC .......... *G02B 6/4204* (2013.01); *G02B 6/425* (2013.01); *G02B 27/1086* (2013.01); *H01S 5/4012* (2013.01); *H01S 5/4087* (2013.01)

(58) Field of Classification Search
    USPC ............... 219/121; 372/18, 29; 356/454; 359/337, 341; 348/463, 669, 676
    See application file for complete search history.

(56) References Cited

U.S. PATENT DOCUMENTS

2012/0014397 A1*   1/2012   Chann ................. H01S 3/2308
                                                          372/18
2017/0304940 A1   10/2017   Ogata
2017/0304941 A1   10/2017   Usuda
2017/0304942 A1*   10/2017   Ogata .................. H01S 5/0021

FOREIGN PATENT DOCUMENTS

| | | |
|---|---|---|
| JP | 2008-44000 A | 2/2008 |
| JP | 2013-233556 A | 11/2013 |
| JP | 2016-78052 A | 5/2016 |
| WO | 2016/046954 A1 | 3/2016 |

OTHER PUBLICATIONS

Decision to Grant a Patent received for Japanese Patent Application No. 2017-541893, dated Sep. 5, 2017, 6 pages including English Translation.

German Office Action dated Jun. 23, 2020 in German Application No. 11 2017 005 790.6.

* cited by examiner

LASER MACHINING DEVICE

CROSS-REFERENCE TO RELATED APPLICATION

The present application is based on PCT filing PCT/JP2017/011119 filed Mar. 21, 2017, the entire contents of which are incorporated herein by reference.

FIELD

The present invention relates to a laser machining device that includes a plurality of oscillators that emit laser beams.

BACKGROUND

In recent years, the development of wavelength coupling technology has enabled high-intensity beams to be achieved with semiconductor lasers, which has been difficult until now. Further, with the increasing use of semiconductor lasers in equipment such as lighting devices and projectors, there has been a corresponding development of blue semiconductor lasers and ultraviolet semiconductor lasers that have high output. Against this background, the developments in short-wavelength semiconductor lasers that have high-output and high-intensity beams of several hundred watts to several kilowatts are progressing by using wavelength coupling technology. Examples of short-wavelength semiconductor lasers are blue and ultraviolet semiconductor lasers, whose output until recently has been limited to being between several milliwatts and several watts.

However, there is a problem in that when a high-output and short-wavelength beam is transmitted to a machining head by a transmission fiber, the beam output is attenuated due to photo-darkening, and therefore high output is suppressed. Photo-darkening is a phenomenon in which laser output is reduced due to an increase in the core loss of a transmission fiber over time.

Patent Literature 1 discloses a technique of transmitting beams each emitted from its corresponding element in a plurality of light-emitting elements. The laser machining device disclosed in Patent Literature 1 includes a plurality of light-emitting elements; a plurality of transmission fibers that each transmit a beam emitted from its corresponding light-emitting element; and a beam coupling unit that couples the beams transmitted by the transmission fibers by using a wavelength dispersion element and outputs the coupled beam to a single transmission fiber.

CITATION LIST

Patent Literature

Patent Literature 1: Japanese Patent Application Laid-open No. 2016-078052

SUMMARY

Technical Problem

However, because a high-output beam coupled by the beam coupling unit is transmitted by a single transmission fiber in the laser machining device disclosed in Patent Literature 1, when a short-wavelength semiconductor laser with an oscillation wavelength of 500 nanometers or less, such as a blue or ultraviolet semiconductor laser, is used, the laser machining device has a problem of increasing transmission loss caused by photo-darkening in the single transmission fiber connected to the beam coupling unit, which results in a reduction of the beam output.

The present invention has been achieved in view of the above problem, and an object of the present invention is to provide a laser machining device that can suppress a reduction in beam output.

Solution to Problem

In order to solve the above problems and achieve the object, a laser machining device according to an aspect of the present invention includes: a plurality of oscillators to emit laser beams having different wavelengths from each other; a machining head to emit laser beams emitted from the respective oscillators to a machining object; a plurality of fibers to transmit the laser beams to the machining head; a wavelength dispersion element provided in the machining head; and an optical element provided in the machining head to superpose laser beams emitted from the fibers on each other. The wavelength dispersion element is arranged at a position at which laser beams are superposed by the optical element.

Advantageous Effects of Invention

The laser machining device according to the present invention has an effect whereby it is possible to suppress a reduction in beam output.

DESCRIPTION OF EMBODIMENTS

A laser machining device according to embodiments of the present invention will be described in detail below with reference to the accompanying drawings. The present invention is not limited to the embodiments.

First Embodiment

Figure 1:
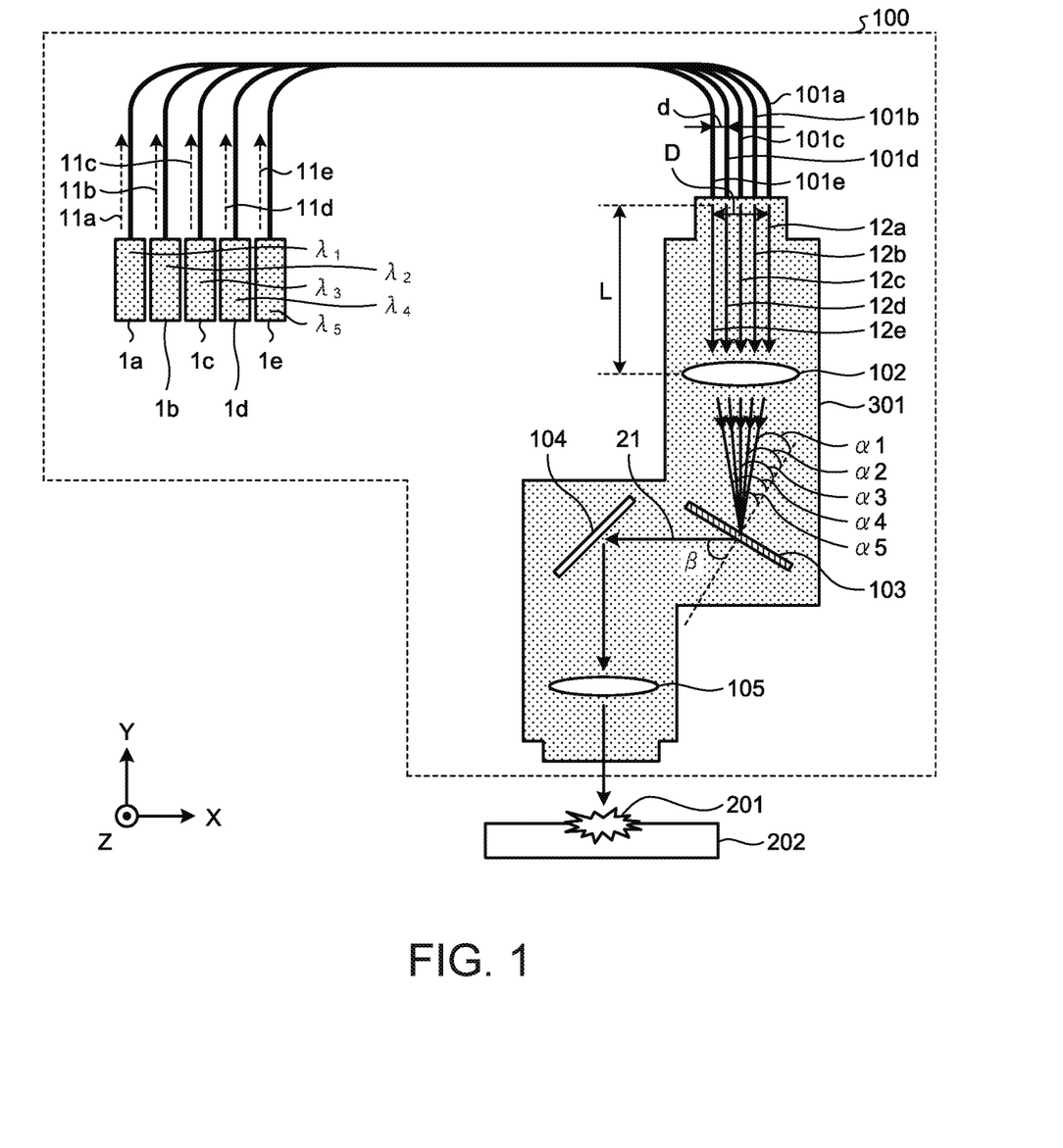
FIG. 1 is a configuration diagram of a laser machining device according to a first embodiment.

FIG. 1 is a configuration diagram of a laser machining device according to a first embodiment. A laser machining device 100 according to the first embodiment includes a plurality of oscillators 1a to 1e each emitting a laser beam, a machining head 301, and a plurality of transmission fibers 101a to 101e. In FIG. 1, it is assumed that, in a right-handed XYZ coordinate system, the direction in which the transmission fibers 101a to 101e extend from the oscillators 1a to 1e to the machining head 301 is an X-axis direction; the direction perpendicular to the X-axis direction is the Y-axis direction; and the direction perpendicular to both the X-axis direction and the Y-axis direction is the Z-axis direction.

The oscillator 1a emits a laser beam with an oscillation wavelength of $\lambda_1$, the oscillator 1b emits a laser beam with an oscillation wavelength of $\lambda_2$, the oscillator 1c emits a laser beam with an oscillation wavelength of $\lambda_3$, the oscillator 1d emits a laser beam with an oscillation wavelength of $\alpha_4$, and the oscillator 1e emits a laser beam with an oscillation wavelength of $\alpha_5$. In the following descriptions, the oscillators 1a to 1e are simply referred to as "a plurality of oscillators 1" and the transmission fibers 101a to 101e are simply referred to as "a plurality of transmission fibers 101" in some cases. The laser beams emitted from their respective oscillators 1a to 1e are first laser beams.

One end of each of the transmission fibers 101 is connected to a corresponding one of the oscillators 1. The other ends of the transmission fibers 101 are connected to the machining head 301. The other ends of the transmission fibers 101 are arranged in parallel to each other on the XY-plane. It is desirable that the transmission fibers 101 are spaced away from each other with an interval therebetween that is optimal for a wavelength coupling process in the machining head 301. The transmission fibers 101 configured as described above transmit, to the machining head 301, the laser beams emitted from their respective oscillators 1.

The machining head 301 includes a wavelength dispersion element 103; a machining lens 105 for machining a machining object 202 by focusing a beam at a machining point 201 on the machining object 202; a focusing lens 102 that is an optical element focusing emission beams 12a to 12e emitted from the respective transmission fibers 101 at one point on the wavelength dispersion element 103 in such a manner that the emission beams 12a to 12e are superposed on each other; and a mirror 104 that transmits a coupled beam coupled by the wavelength dispersion element 103 to the machining lens 105. The machining head 301 configured as described above emits the laser beams emitted from their respective oscillators 1 to the machining object 202. The emission beams 12a to 12e emitted from their respective transmission fibers fibers 101 are second laser beams.

An operation of the laser machining device 100 is described here. Oscillation beams 11a to 11e emitted from the oscillators 1 are transmitted to the machining head 301 via the transmission fibers 101. The oscillation beams 11a to 11e transmitted to the machining head 301 are emitted from the other ends of the transmission fibers 101 to the inside of the machining head 301. The oscillation beams 11a to 11e emitted to the inside of the machining head 301 are focused as the emission beams 12a to 12e by the focusing lens 102 so as to be superposed on each other at one point on the wavelength dispersion element 103.

Because the transmission fibers 101 are arranged to be spaced from each other in the X-axis direction on the XY-plane as described above, the emission beams 12a to 12e are incident on the wavelength dispersion element 103 at different angles $\alpha1$ to $\alpha5$ on the XY-plane, respectively. The angles $\alpha1$ to $\alpha5$ are incident angles of the emission beams 12a to 12e with respect to the normal of the plane of the wavelength dispersion element 103.

The emission beams 12a to 12e incident on the wavelength dispersion element 103 are diffracted by the wavelength dispersion element 103. In a case where the wavelength dispersion element 103 is a diffraction grating, a diffraction angle $\beta$ of the wavelength dispersion element 103 can be obtained by using $N\lambda = \sin\alpha + \sin\beta$, where N is the groove-number density and $\lambda$ is an oscillation wavelength.

A specific example is described here. Assuming that the groove-number density N is 1850 per millimeter, the oscillation wavelength $\lambda_3$ is 980 nanometers, and the incident angle $\alpha3$ is 65.03 degrees, then the diffraction angle $\beta$ is 65.03 degrees as given by $N\lambda = \sin\alpha + \sin\beta$. Here, assuming that an entire width D in the X-axis direction between the transmission fiber 101a and the transmission fiber 101e at a point of connection to the machining head 301 is 8 millimeters, a clearance d between adjacent fibers of the transmission fibers 101a to 101e at the point of connection to the machining head 301 is 2 millimeters, the focal length of the focusing lens 102 is 100 millimeters, a distance L from the other ends of the transmission fibers 101 to the focusing lens 102 is 100 millimeters, the oscillation wavelength $\lambda_1$ is 988.7 nanometers, the oscillation wavelength $\lambda_2$ is 984.5 nanometers, the oscillation wavelength $\lambda_3$ is 980.0 nanometers, the oscillation wavelength $\lambda_4$ is 975.3 nanometers, and the oscillation wavelength $\lambda_5$ is 970.5 nanometers, then the diffraction angle $\beta$ is 65.03 degrees.

The wavelength dispersion element 103 arranged at a specific angle combines the beams that have been focused by the focusing lens 102 to be superposed on each other at one point on the wavelength dispersion element 103 into one beam and outputs the one beam. The emission beams 12a to 12e superposed on the wavelength dispersion element 103 are coupled by the wavelength dispersion effect of the wavelength dispersion element 103 into one coupled beam 21. The coupled beam 21 is transmitted to the machining lens 105 by the mirror 104, and it is focused at the machining point 201 on the machining object 202 by the machining lens 105. In this manner, it is possible to machine the machining object 202 by using a high-output and high-intensity beam.

Figure 2:
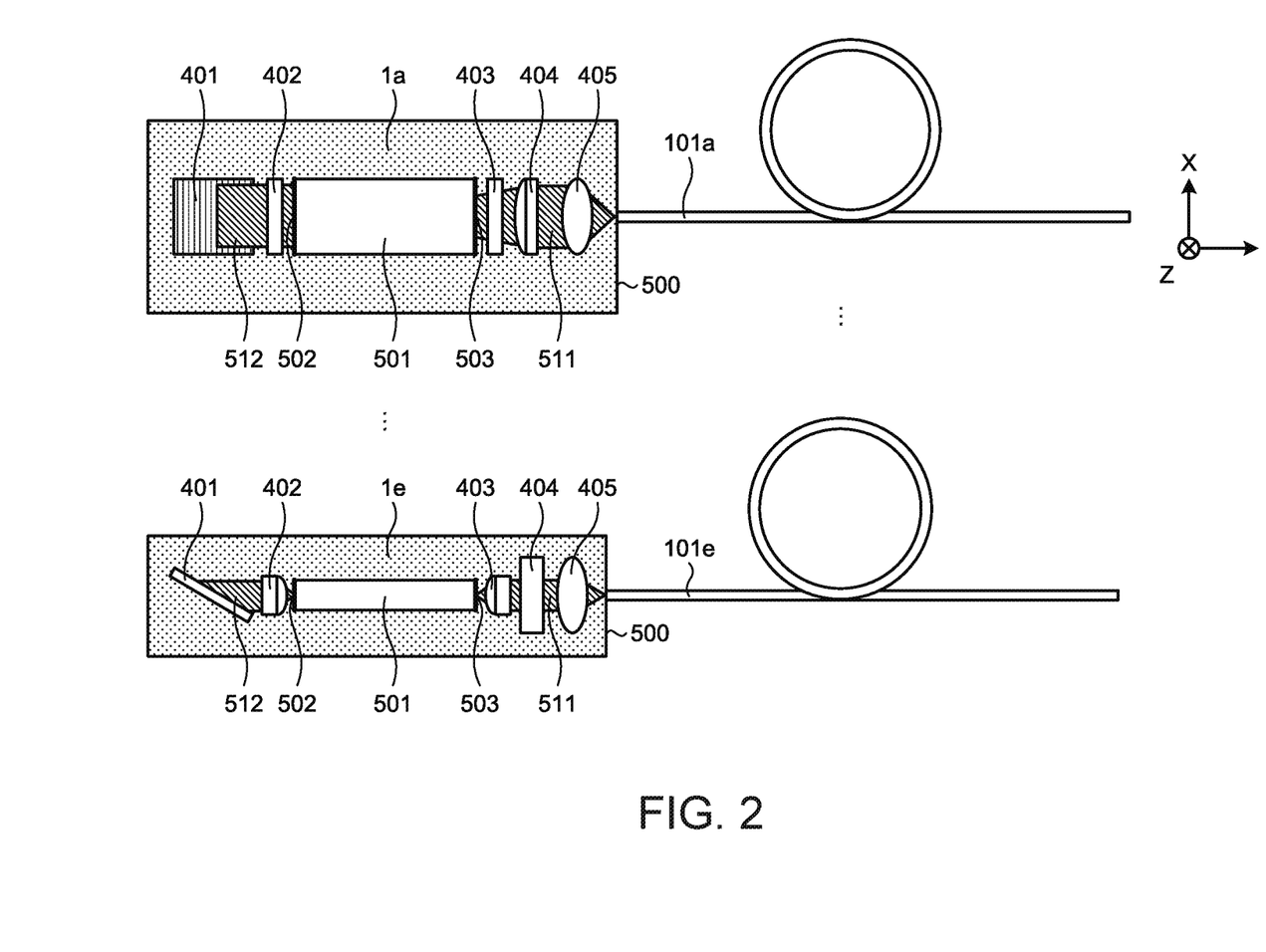
FIG. 2 is a diagram illustrating a first example configuration of an oscillator illustrated in FIG. 1.
Figure 3:
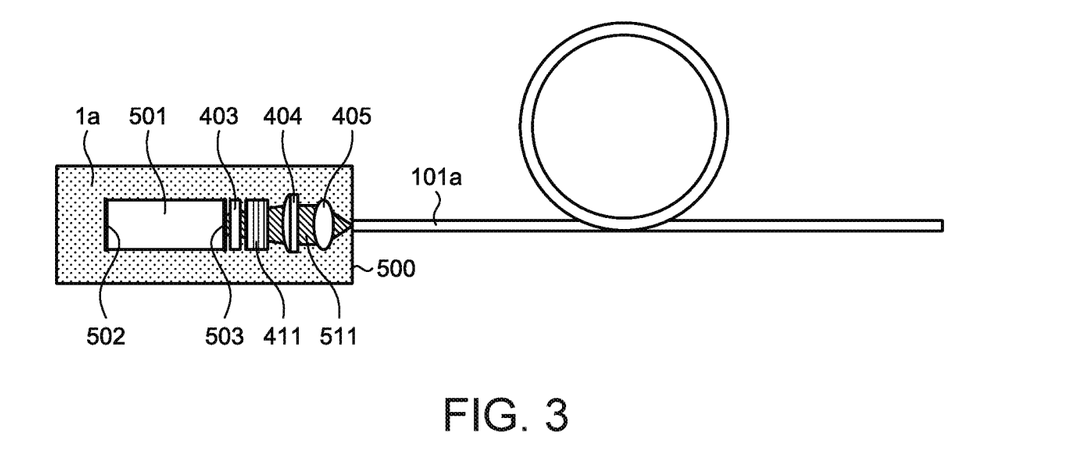
FIG. 3 is a diagram illustrating a second example configuration of the oscillator illustrated in FIG. 1.
Figure 4:
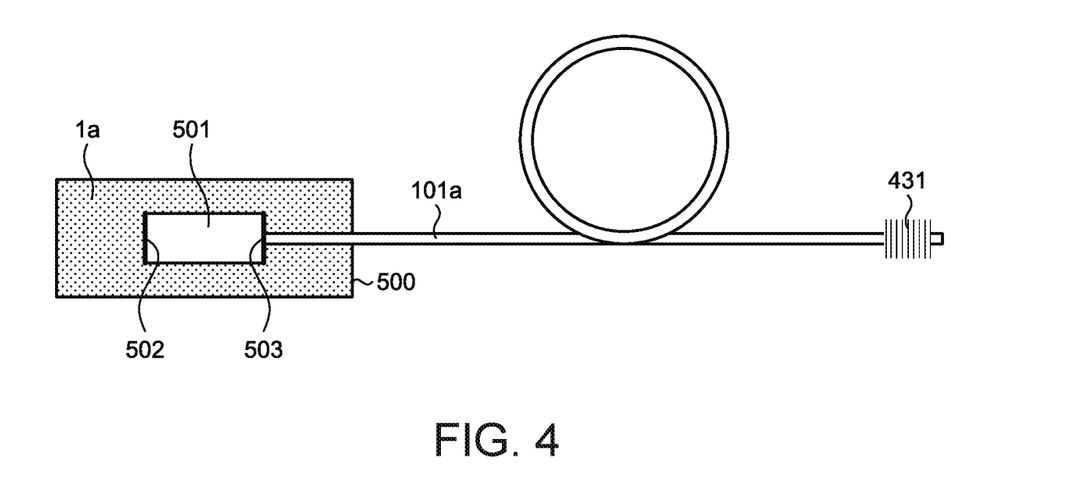
FIG. 4 is a diagram illustrating a third example configuration of the oscillator illustrated in FIG. 1.

With reference to FIGS. 2 to 4, example configurations of the oscillators 1 included in the laser machining device 100 according to the first embodiment are described below.

FIG. 2 is a diagram illustrating a first example configuration of the oscillator illustrated in FIG. 1. FIG. 2 illustrates an example configuration of each of the oscillators 1a and 1e among the oscillators 1a to 1e illustrated in FIG. 1, but it omits illustration of the oscillators 1b to 1d illustrated in FIG. 1. In FIG. 2, it is assumed that, in a right-handed XYZ coordinate system, the direction in which laser beams are emitted from the oscillators 1a and 1e to the transmission fibers 101a and 101e is the Y-axis direction, the direction perpendicular to the Y-axis direction is the X-axis direction, and the direction perpendicular to both the X-axis direction and the Y-axis direction is the Z-axis direction. FIG. 2 illustrates an example configuration of the oscillator 1a in plan view in the Z-direction, and it further illustrates an example configuration of the oscillator 1e in plan view in the X-axis direction.

Each of the oscillators 1a to 1e illustrated in FIG. 2 includes a case 500 that forms the outline of the corresponding oscillator 1; a semiconductor laser 501; a resonance beam collimating element 402 provided on the rear side of the semiconductor laser 501 in the Y-axis direction; and a diffraction grating 401 that is a wavelength dispersion element provided on the rear side of the resonance beam collimating element 402 in the Y-axis direction.

Each of the oscillators 1a to 1e further includes a Z-axis beam collimating element 403 provided on the front side of the semiconductor laser 501 in the Y-axis direction; an X-axis beam collimating element 404 provided on the front side of the Z-axis beam collimating element 403 in the Y-axis direction; and a fiber coupling element 405 provided on the front side of the X-axis beam collimating element 404 in the Y-axis direction.

The semiconductor laser 501, the diffraction grating 401, the resonance beam collimating element 402, the Z-axis beam collimating element 403, the X-axis beam collimating element 404, and the fiber coupling element 405 are arranged inside the case 500. In FIG. 2, illustration of a radiator for radiating heat generated in the semiconductor laser 501 to the outside of the case 500 is omitted.

An operation of the oscillators 1a to 1e is described here. An external resonator is configured between a front end surface 503 of the semiconductor laser 501 and the diffraction grating 401; therefore, laser oscillation is caused to occur in the semiconductor laser 501. The front end surface 503 has a partial reflection coating thereon, and therefore a portion of a beam emitted from the semiconductor laser 501 propagates to the diffraction grating 401 and the remaining portion is output as an oscillation beam 511.

The resonance beam collimating element 402 is an element that collimates an external-resonator beam 512 emitted from a rear end surface 502 of the semiconductor laser 501 in the Y-axis direction, and it is used for increasing the feedback ratio of the external-resonator beam 512, emitted from the rear end surface 502, from the diffraction grating 401 to the semiconductor laser 501. It is preferable that an antireflection coating is applied to the rear end surface 502. The oscillation beam 511 emitted from the semiconductor laser 501 is collimated by the Z-axis beam collimating element 403 and the X-axis beam collimating element 404, and it is coupled by the fiber coupling element 405 to be output to the transmission fiber 101.

According to the first example configuration illustrated in FIG. 2, it is possible to vary the value of an oscillation wavelength in accordance with the angle of the diffraction grating 401 by adjusting the angle of the diffraction grating 401.

An example of a mechanism that varies the wavelength by adjusting the angle of the diffraction grating 401 is a wavelength varying mechanism configured from a rack and pinion. In the case of using an electric wavelength varying mechanism, a table including instruction values that determine oscillation wavelengths and associated rotation amounts is stored in a memory (not illustrated) included in the laser machining device 100. When receiving an instruction value, a controller (not illustrated) provided in the laser machining device 100 refers to the table and drives a servo motor with a rotation amount associated with the instruction value. Rotation of the servo motor drives the rack and pinion to turn the diffraction grating 401, whereby the oscillation wavelength is varied.

According to the first example configuration illustrated in FIG. 2, an oscillation wavelength can be adjusted by using the same type of diffraction grating 401 in each of the oscillators 1. Therefore, when compared with a case of using different types of diffraction gratings, the yield is increased and the assembling time of each oscillator 1 is reduced. Accordingly, the manufacturing cost of the laser machining device 100 can be reduced.

FIG. 3 is a diagram illustrating a second example configuration of the oscillator illustrated in FIG. 1. The oscillator 1a illustrated in FIG. 3 is provided with a VBG (Volume Bragg Grating) 411 in place of the diffraction grating 401 and the resonance beam collimating element 402 illustrated in FIG. 2. An external resonator is configured between the rear end surface 502 of the semiconductor laser 501 and the VBG 411. The VBG 411 is an element that has a periodically changing refractive index formed inside glass. The periodically changing refractive index serves as a diffraction grating. Therefore, in the second example configuration, it is possible to reflect only light with a wavelength that satisfies the Bragg's reflection condition generated by the period of the diffraction grating. By using the VBG 411 as a partial reflection mirror of the external resonator, oscillation can be caused to occur at a specific oscillation wavelength.

However, for varying an oscillation wavelength, it is necessary to use the VBGs 411 that are different from each other in the periods formed therein. Therefore, in the second example configuration, it is necessary to prepare the VBGs 411 such that the number thereof corresponds to the number of types of the oscillation wavelengths. The oscillation beam 511 emitted from the semiconductor laser 501 is collimated by the Z-axis beam collimating element 403 and the X-axis beam collimating element 404, and it is coupled by the fiber coupling element 405 to be output to the transmission fiber 101a. According to the second example configuration illustrated in FIG. 3, a mechanism that drives and turns the diffraction grating 401 illustrated in FIG. 2 is not required. Therefore, the configuration is simplified, enabling long-term use.

FIG. 4 is a diagram illustrating a third example configuration of the oscillator illustrated in FIG. 1. The diffraction grating 401, the resonance beam collimating element 402, the Z-axis beam collimating element 403, the X-axis beam collimating element 404, and the fiber coupling element 405 illustrated in FIG. 2 are omitted in the oscillator 1a illustrated in FIG. 4. Instead, an FBG (Fiber Bragg Grating) 431 is formed at the termination end of the transmission fiber 101a. An external resonator is configured between the rear end surface 502 of the semiconductor laser 501 and the FBG 431.

Although the FBG 431 is formed at the termination end of the transmission fiber 101a in the third example configuration in FIG. 4, the FBG 431 may be formed at any position along the transmission fiber 101a. In a similar manner to the VBG 411 illustrated in FIG. 3, the FBG 431 is an element that has a periodically changing refractive index formed inside glass. The periodically changing refractive index serves as a diffraction grating, and it can reflect only light with a wavelength that satisfies the Bragg's reflection condition generated by the period of the diffraction grating. By using the FBG 431 as a partial reflection mirror of the external resonator, oscillation can be caused to occur at a specific wavelength.

In order to vary the oscillation wavelength, in a similar manner to the VBGs 411 illustrated in FIG. 3, it is necessary to prepare the FBGs 431 such that the number thereof corresponds to the number of the types of the oscillation wavelengths. However, according to the third example configuration illustrated in FIG. 4, a mechanism that drives and turns the diffraction grating 401 illustrated in FIG. 2 is not required, and thus the configuration is simplified, as in the second example configuration illustrated in FIG. 3. Therefore, long-term use is possible.

Although the semiconductor laser 501 and the transmission fiber 101a are directly coupled to each other in the third example configuration illustrated in FIG. 4, the semiconductor laser 501 and the transmission fiber 101a may be coupled using the fiber coupling element 405 as in the example configurations illustrated in FIGS. 2 and 3.

Further, although the semiconductor laser 501 is used in each of the oscillators 1 according to the first embodiment, the laser is not limited to the semiconductor laser 501 as long as the oscillation wavelength thereof is fixed. Any of a fiber laser, which is a type of solid-state laser using an optical fiber as an amplifying medium, and a solid-state laser may be used in place of the semiconductor laser 501. Examples of a solid-state laser are a YAG (Yttrium Aluminum Garnet) laser and a YVO4 (Yttrium Orthovanadate) laser that use a laser crystal.

The laser machining device 100 according to the first embodiment can transmit beams to the machining head 301 by using the transmission fibers 101, and it can achieve wavelength coupling within the machining head 301. Therefore, with the laser machining device 100 according to the first embodiment, it is possible to suppress transmission loss caused by photo-darkening, which is a problem when a high-output and high-intensity beam is transmitted by a single fiber, while at the same time ensuring ease of handling of a beam, which is unique to a fiber that is excellent in flexibility.

In the conventional technique disclosed in Patent Literature 1, when a short-wavelength semiconductor laser with an oscillation wavelength of 500 nanometers or less, for example, a blue or ultraviolet semiconductor laser, is used, transmission loss caused by photo-darkening is increased and the beam output is reduced. Conversely, with the laser machining device 100 according to the first embodiment, the increase of transmission loss caused by photo-darkening is suppressed for the long term even when a short-wavelength semiconductor laser is used. Therefore, long-term use of a transmission fiber is possible, and a remarkable advantageous effect is obtained in the short-wavelength region of 900 nanometers or less.

Second Embodiment

Figure 5:
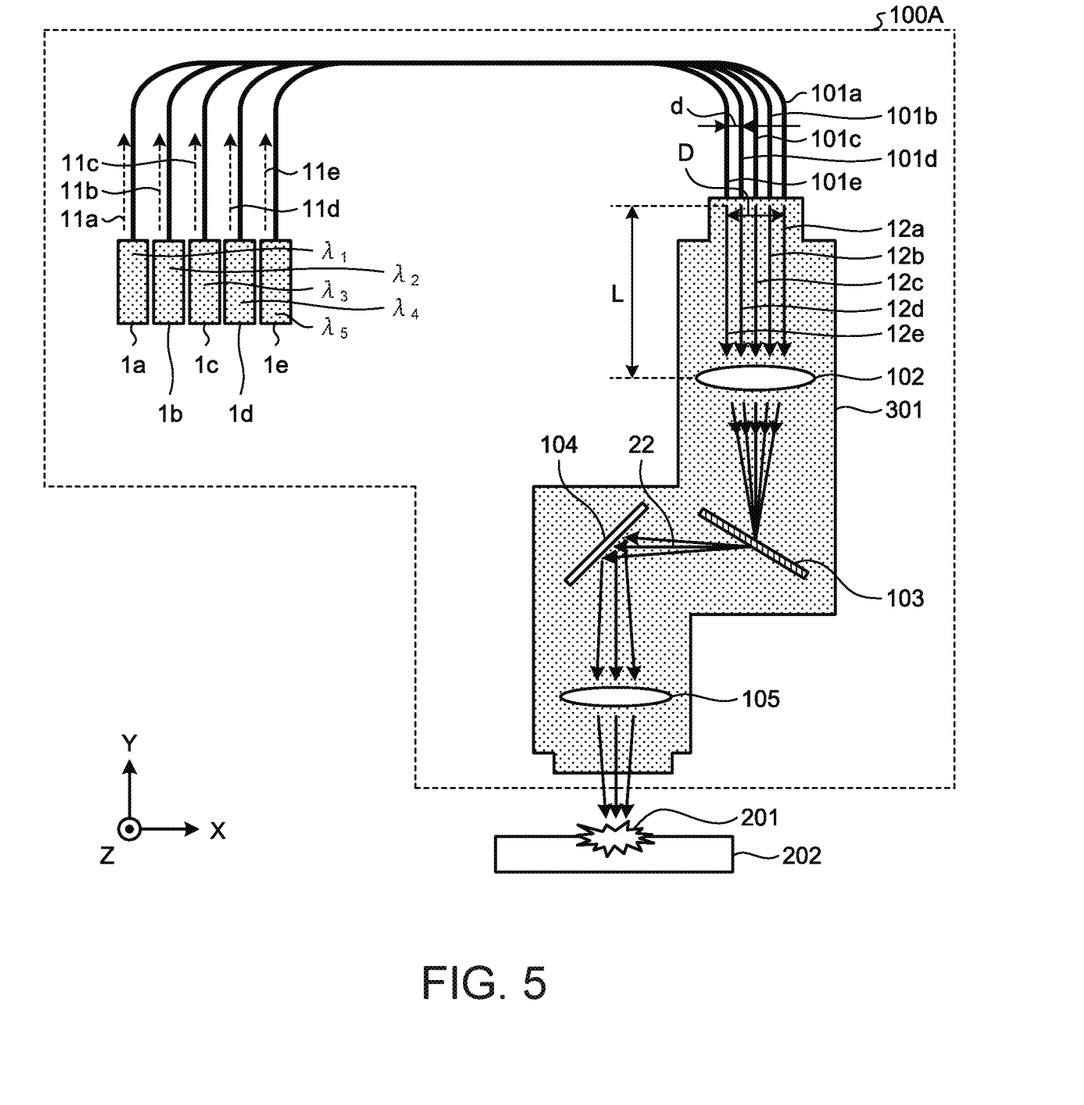
FIG. 5 is a configuration diagram of a laser machining device according to a second embodiment.

FIG. 5 is a configuration diagram of a laser machining device according to a second embodiment. In a laser machining device 100A according to the second embodiment, respective oscillation wavelengths of the oscillators 1 are varied; therefore, the emission beams 12a to 12e superposed on each other on the wavelength dispersion element 103 are split toward specific directions as split beams 22. Use of the split beams 22 enables a specific beam shape suitable for machining the machining object 202 to be obtained. As a method of varying the oscillation wavelength of the oscillator 1, adjusting the angle of the diffraction grating 401 in the first example configuration illustrated in FIG. 2 is sufficient. In the laser machining device according to the second embodiment, the split beams 22 are obtained by varying the wavelengths of laser beams incident on the wavelength dispersion element 103.

Figure 6:
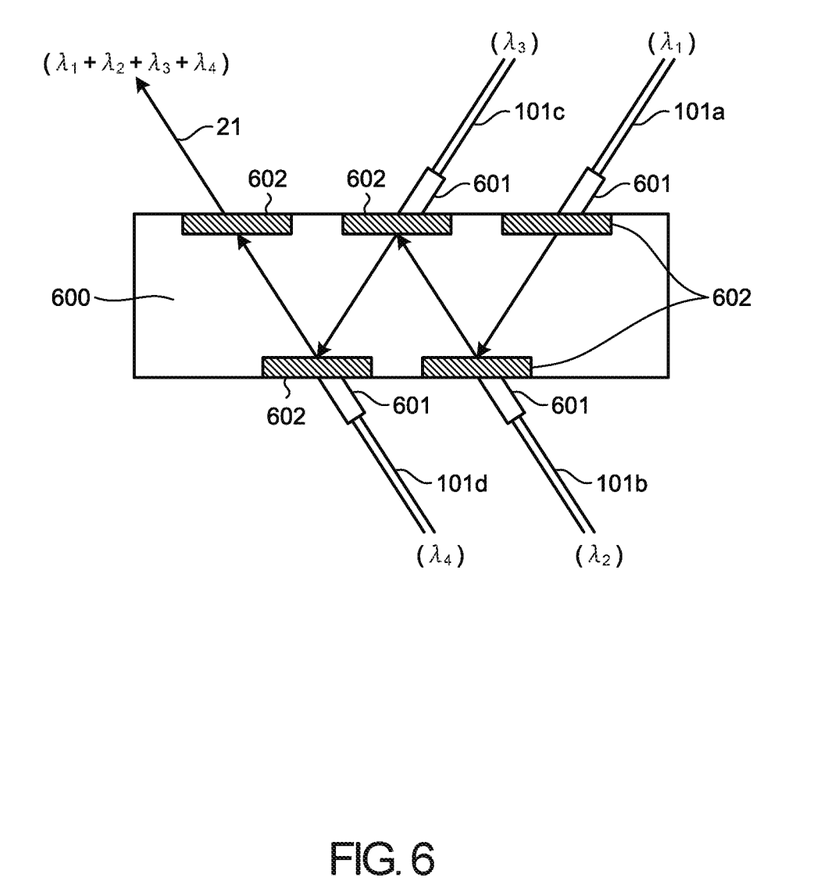
FIG. 6 is an explanatory diagram of an example configuration in which a coupled beam is obtained by using an etalon.

Although the example configuration in which a coupled beam is obtained by using the wavelength dispersion element 103 is described in the first embodiment, an etalon may be used instead of the wavelength dispersion element 103. FIG. 6 is an explanatory diagram of an example configuration in which a coupled beam is obtained by using an etalon. A glass substrate 600 illustrated in FIG. 6 is arranged in the machining head 301 in place of the focusing lens 102 and the wavelength dispersion element 103 illustrated in FIG. 1. Four collimators 601 and etalons 602 are provided in the glass substrate 600 as an example. Further, four transmission fibers 101a, 101b, 101c, and 101d are connected to the glass substrate 600, for example. Each of the four transmission fibers 101a, 101b, 101c, and 101d is connected to the glass substrate 600 via its corresponding collimator 601. Each of the collimators 601 collimates a beam transmitted to a corresponding one of the four transmission fibers 101a, 101b, 101c, and 101d. The etalon 602, which is a dielectric multilayer filter provided in the glass substrate 600, only allows a beam with a specific wavelength among the beams collimated by the collimators 601 to pass therethrough. The beams that have passed through the four etalons 602 are coupled in the glass substrate 600 and are output as one coupled beam 21.

Although five oscillators and five transmission fibers are used in the first and second embodiments, the number of each of the oscillators and transmission fibers may be any number equal to or larger than two. Further, although, in the first and second embodiments, the oscillation wavelength of a laser beam emitted from each of the oscillators 1 is longer than 900 nanometers, it may be equal to or shorter than 900 nanometers. Also in a configuration in which the oscillation wavelength of the laser beam emitted from each of the oscillators 1 is equal to or shorter than 900 nanometers, the laser machining devices of the first and second embodiments can suppress a reduction of the beam output caused by photo-darkening. Therefore, a remarkable advantageous effect is obtained when compared with the conventional technique disclosed in Patent Literature 1.

The wavelength dispersion element 103 according to the first embodiment may be configured to output a collected beam having one optical axis as a beam having one optical axis or as a plurality of split beams by varying the wavelength of a laser beam by using a wavelength varying mechanism. With this configuration, the coupled beam 21 as illustrated in FIG. 1 or the split beams 22 as illustrated in FIG. 5 is obtained by adjusting the wavelength varying mechanism in place of the diffraction angle of the wavelength dispersion element 103.

The wavelength dispersion element 103 according to the second embodiment may be configured to output a collected beam having one optical axis as a beam having one optical axis or as a plurality of split beams by allowing the diffraction angle of the wavelength dispersion element 103 to be adjusted. For adjustment of the diffraction angle of the wavelength dispersion element 103, a mechanism similar to the wavelength varying mechanism described above is used. With this configuration, the coupled beam 21 as illustrated in FIG. 1 or the split beams 22 as illustrated in FIG. 5 is obtained by adjusting the diffraction angle of the wavelength dispersion element 103 in place of adjusting the angle of the diffraction grating 401.

The configurations described in the above embodiments are only examples of an aspect of the present invention. The configurations can be combined with other well-known techniques, and a part of each configuration can be omitted or modified without departing from the scope of the present invention.

REFERENCE SIGNS LIST 1a, 1b, 1c, 1d, 1e oscillator, 11a, 11b, 11c, 11d, 11e oscillation beam, 12a, 12b, 12c, 12d, 12e emission beam, 21 coupled beam, 22 split beam, 100, 100A laser machining device, 101, 101a, 101b, 101c, 101d, 101e transmission fiber, 102 focusing lens, 103 wavelength dispersion element, 104 mirror, 105 machining lens, 201 machining point, 202 machining object, 301 machining head, 401 diffraction grating, 402 resonance beam collimating element, 403 Z-axis beam collimating element, 404 X-axis beam collimating element, 405 fiber coupling element, 500 case, 501 semiconductor laser, 502 rear end surface, 503 front end surface, 512 external-resonator beam, 600 glass substrate, 601 collimator, 602 etalon.

The invention claimed is:

1. A laser machining device comprising:
   a plurality of oscillators to emit laser beams having different wavelengths from each other;
   a machining head to emit laser beams emitted from the respective oscillators to a machining object;
   a plurality of fibers to transmit the laser beams to the machining head;
   a wavelength dispersion element provided in the machining head; and
   an optical element provided in the machining head to superpose laser beams emitted from the fibers on each other, wherein
   the wavelength dispersion element is arranged at a position at which laser beams are superposed by the optical element,
   a first end of each of the plurality of fibers is connected to a corresponding one of the plurality of oscillators;
   a second end of each of the plurality of fibers is arranged along a same plane and in parallel to each other at the machining head; and
   the second end of each of the plurality of fibers is spaced apart from each other by an interval there between in the plane;
   a machining lens arranged between the wavelength dispersion element and the machining object, the machining lens to focus laser beams output by the wavelength dispersion element at a machining point on the machining object; and
   a mirror arranged between the wavelength dispersion element and the machining lens to change a direction of the laser beams output by the wavelength dispersion element.

2. The laser machining device according to claim 1, wherein the wavelength dispersion element outputs laser beams superposed by the optical element as a beam having one optical axis or as split beams by allowing a diffraction angle of the wavelength dispersion element to be adjusted.

3. The laser machining device according to claim 1, wherein a wavelength of the laser beams is equal to or shorter than 900 nanometers.

4. The laser machining device according to claim 2, wherein a wavelength of the laser beams is equal to or shorter than 900 nanometers.

5. A laser machining device comprising;
   a plurality of oscillators to emit laser beams having different wavelengths from each other;
   a machining head to emit laser beams emitted from the respective oscillators to a machining object;
   a plurality of fibers to transmit the laser beams to the machining head;
   a diffraction grating provided in the machining head; and
   a lens provided in the machining head to superpose laser beams emitted from the fibers on each other, wherein
   the diffraction grating is arranged at a position at which laser beams are superposed by the lens,
   a first end of each of the plurality of fibers is connected to a corresponding one of the plurality of oscillators,
   a second end of each of the plurality of fibers is arranged along a same plane and in parallel to each other at the machining head, and
   the second end of each of the plurality of fibers is spaced apart from each other by an interval therebetween in the plane;
   a machining lens arranged between the diffraction grating and the machining object, the machining lens to focus laser beams output by the diffraction grating at a machining point on the machining object, and
   a mirror arranged between the diffraction crating and the machining lens to change a direction of the laser beams output by the diffraction grating.

6. The laser machining device according to claim 1, further comprising the machining lens arranged in the machining head and between the wavelength dispersion element and the machining object, the machining lens to directly focus laser beams output by the wavelength dispersion element at a machining point on the machining object.

* * * * *